United States Patent [19]
Lin

[11] Patent Number: 6,066,536
[45] Date of Patent: May 23, 2000

[54] METHOD OF MANUFACTURING A VARIABLE CAPACITOR

[75] Inventor: Yung-Hsi Lin, Hsinchu, Taiwan

[73] Assignee: Industrial Technology Research Institute, Hsinchu, Taiwan

[21] Appl. No.: 09/323,762

[22] Filed: Jun. 1, 1999

Related U.S. Application Data

[62] Division of application No. 08/972,810, Nov. 18, 1997.
[51] Int. Cl.⁷ .................................................. H01L 21/20
[52] U.S. Cl. ........................ 438/379; 438/393; 438/396; 438/253
[58] Field of Search .................................. 438/379, 393, 438/253, 396

Primary Examiner—John F. Niebling
Assistant Examiner—Jennifer M. Kennedy
Attorney, Agent, or Firm—W. Wayne Liauh

[57] ABSTRACT

The invention discloses a variable capacitor including a first storage electrode, a second storage electrode, and a variable length means coupled therebetween. The capacitance can be adjusted by varying a dielectric space therebetween according with an electrical input. The method for manufacturing a variable capacitor in an integrated circuit includes the steps of forming a first storage electrode, a first dielectric layer, a second dielectric layer, a pair of contact channels, and a second sacrificial layer. The method further includes forming a third sacrificial layer, a second storage electrode, a resistor pattern, a passivation layer, and etching the third, the second, and the first sacrificial layer for having a dielectric space between the first storage electrode and the second storage electrode.

18 Claims, 9 Drawing Sheets

METHOD OF MANUFACTURING A VARIABLE CAPACITOR

CROSS REFERENCE TO RELATED APPLICATIONS

This invention is a divisional application of an application which is filed at Nov. 18, 1997 with a Ser. No. 08/972,810 under the same inventor and the same assignee as the present application.

FIELD OF THE INVENTION

The present invention relates to capacitors, and more specifically, to a variable capacitor and a method of manufacturing the same.

BACKGROUND OF THE INVENTION

Capacitors are circuit elements that store electrical energy by keeping electric charge in an electric field. The capacitors are used with the characteristics of storing input electricity as electric memories. Capacitors have became essential electrical elements for applications in numerous electric circuits. Electric circuits usually utilize a great number and various type of capacitors, especially the circuits associated with frequency domain signal or AC signals power supply device and filtering circuits. In the decades, wireless communication through digital and analog signals has been developed progressively to make the whole world an earth village. Capacitors applied in filtering circuits, power supply, and wireless communication device and circuits are vital elements, with the critical specifications on the performance of capacitors.

Without limiting the scope of the invention, the background of the present invention illustrates a capacitor utilized and formed on a semiconductor substrate in general. Referring to FIG. 1, a prior art capacitor 10 is former on a semiconductor substrate 12 in partial cross section view. A first storage electrode 14 is formed on the substrate 12 by depositing and patterning a conductive layer. An ion implantation to a region on the substrate for forming a conductive area can also be utilized in forming the first storage electrode. A dielectric layer 16 is then formed above the first storage electrode 18. The dielectric layer 16 having high permittivity, such as silicon dioxide and silicon nitride, is formed by performing a chemical vapor deposition (CVD), a lithography, and an etching process. Finally, series of processes including physical vapor deposition, lithography, and etching are employed in forming a second storage electrode 18 above the dielectric layer 16, fabricating the capacitor 10 mentioned above. A planar capacitor with a fixed capacitance is finished in the semiconductor manufacturing processes.

Numerous capacitors are applied in filtering circuits, power supplying devices, and wireless communication circuits. The capacitors serve as vital elements with the critical specifications on their accuracy and performance. The application of capacitors can be divided as two kinds, the variable capacitance capacitors and the fixed capacitance capacitors. The variable capacitance capacitors are widely utilized in filtering circuits and power supplying devices. Conventional semiconductor manufacturing processes are unable to form a variable capacitor within the integrated circuits. Thus an integrated circuits must connect with the additional variable capacitor devices for filtering circuits and power supply applications. The additional variable capacitor devices not only increase the size of the whole circuits but also bring a problem of instability under electromagnetic noise.

Fixed capacitance capacitors are employed in numerous circuits with a specification on accurate capacitance. With higher integration in integrated circuits, each electrical element is reduced to the minimum and optimum scale of lithography in size. In such a scale, a high accuracy in size of pattern is hard to achieve on the semiconductor with present lithography and etching process. Thus the deviation in the accuracy of the capacitance are very frequent for a semiconductor manufacturing process. An accurate capacitance must be obtained through combining a number of capacitors connecting in parallel. In order to meet the requirements for applications in wireless communication device and circuits. In addition, the exact capacitance of each capacitor is unexpected before it is finished with semiconductor processes. The exact capacitance is measured by probing on the wafer of the semiconductor. At that time, the capacitance is already fixed and no more modification or tuning is possible. Connecting capacitors in parallel for obtaining specified capacitance further complicates the circuits. The connections also exploits more elements and needs more space on a wafer. Time wasted with above efforts leads to inefficiency and raises the manufacturing cost with the complicate circuits.

SUMMARY OF THE INVENTION

The present invention provides a variable capacitor and a method of manufacturing a variable capacitor. The capacitance of the variable capacitor can be adjusted in real time with the specification of the circuits by an electric signal with related circuits for an specified accurate value. In the present invention, the method of manufacturing the variable capacitor is described with the processes in semiconductor field. The method can be associated without difficulties into typical semiconductor manufacturing process for making integrated circuits of complementary metal oxide semiconductor (CMOS), bipolar complementary metal oxide semiconductor (BiCMOS), and bipolar junction transistor (BJT).

A variable capacitor in the present invention includes a first storage electrode of and a second storage electrode, both electrodes are made of conductive materials. The two storage electrodes are coupled through a variable length means therebetween. The variable length means splits the first storage electrode the second storage electrode apart. In according to an electrical input, the variable length means varies the capacitance by varying the dielectric space therebetween. Besides, two or more layers of dielectric material can be placed between and adjacent to said first storage electrode and said second storage electrode plate.

The method for manufacturing a variable capacitor in an integrated circuit includes forming a first storage electrode on the substrate and forming a first dielectric layer on the first storage electrode and the substrate. The method further includes forming a first sacrificial layer on the first dielectric layer, removing a portion of the first sacrificial layer for forming a dielectric region substantially above the first storage electrode. The method has following processes of forming a second dielectric layer on the first sacrificial layer and the first dielectric layer, and removing a portion of the second dielectric layer for having a pair of contact channels to the first sacrificial layer, substantially above a pair of edges of the first sacrificial layer. A second sacrificial layer is formed over the first sacrificial layer within the pair of contact channels and over the second dielectric layer, and a portion of the second sacrificial layer is removed for leaving a portion within the pair of contact channels.

A second conductive layer is formed on the second sacrificial layer and the second dielectric layer, then a third sacrificial layer, a second storage electrode, and a resistor pattern are formed by removing a portion of the second conductive layer. The method further includes forming a passivation layer on the third sacrificial layer, the second storage electrode, the resistor pattern, and the second dielectric layer and removing a portion of the passivation layer for exposing the third sacrificial layer.

Finally, the process is completed by removing the third sacrificial layer, the second sacrificial layer, and the first sacrificial layer for having a dielectric space between the first storage electrode and the second storage electrode.

Therefore, a capacitor with variable capacitance is manufactured. The capacitance can be modified and tuned through an electric input for providing an accurate value to a specification. The method can greatly reduce the size of the filtering circuits and power supplying devices by integrating a variable capacitor within the integrated circuits. A complicate way is no longer needed for obtaining expected capacitance through connecting capacitors in parallel. The method of the present invention is compatible with the conventional semiconductor process thus greatly eliminates the great efforts for accomplishing an accurate capacitor in the typical method and thus reduces the manufacturing cost.

DETAILED DESCRIPTION OF THE PREFERRED EMBODIMENT

Without limiting the scope of the present invention, a preferred embodiment of the present invention is described with the semiconductor process in general. A method of manufacturing a variable capacitor on a semiconductor substrate is illustrated solely for providing a clear understanding and a concise illustration. Under the same spirit, there is no doubt that a similar variable capacitor structure can be easily figured without further description, for manufacturing a single capacitor element not with a semiconductor.

Figure 1:
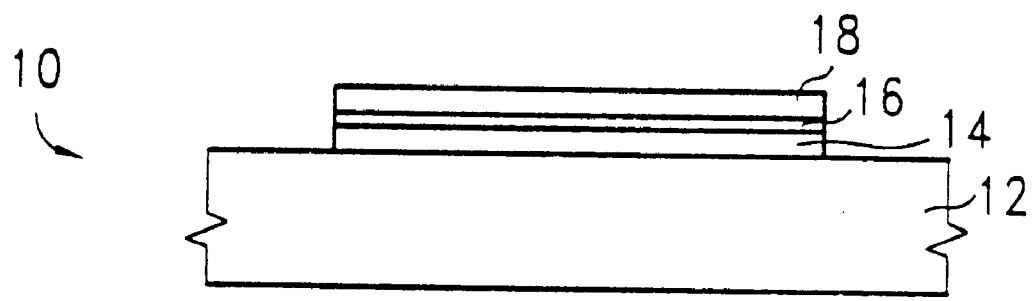
FIG. 1 shows a cross sectional view of a conventional capacitor formed on a semiconductor substrate.
Figure 2A:
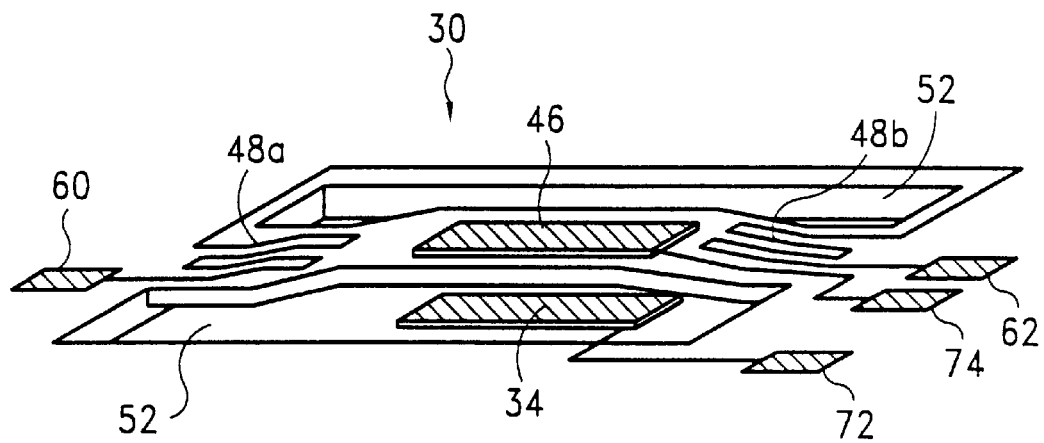
FIG. 2a shows a perspective view of a variable capacitor in the present invention.
Figure 7A:
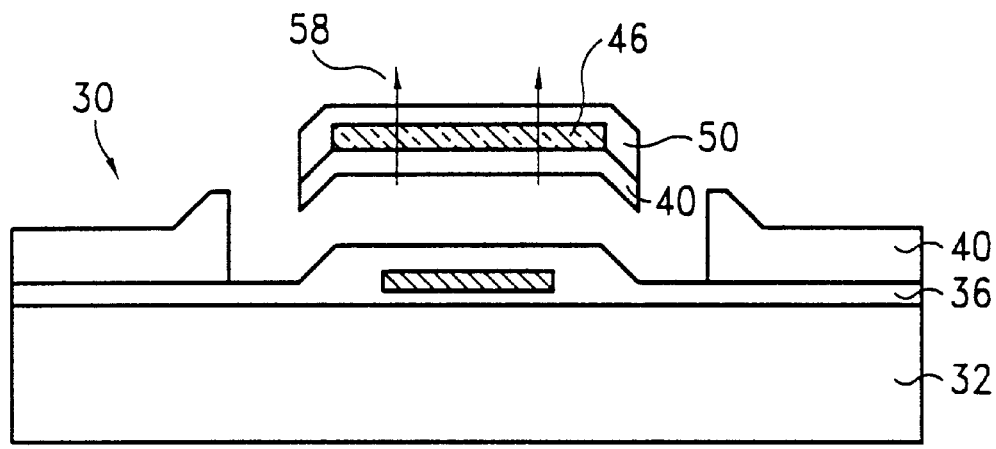
FIG. 7a, in a side cross section view with respect to reference line 100, illustrates the expansion of the dielectric space by the thermal buckling of the supporting arms under electrical heating.
Figure 7B:
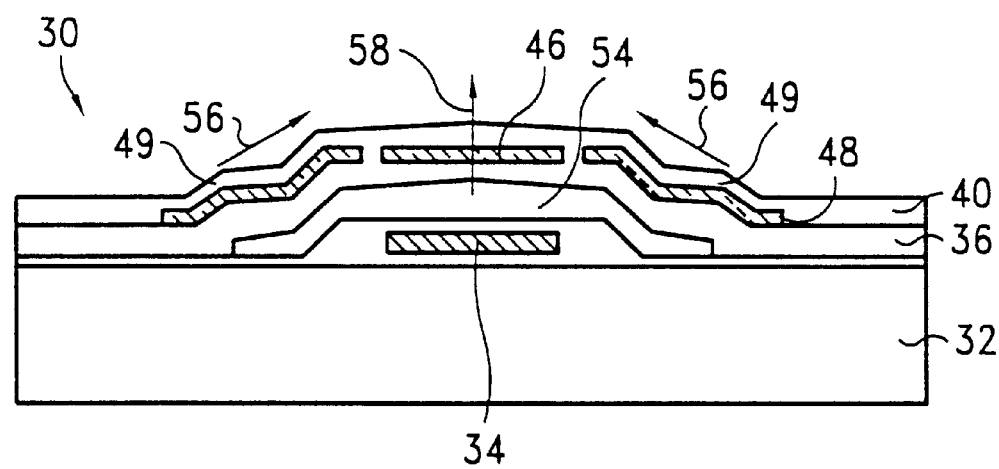
FIG. 7b, in a front cross section view with respect to reference line 200, illustrates the expansion of the dielectric space by the thermal buckling of the supporting arms under electrical heating.

Referring to FIG. 2a, a schematically perspective view of a variable capacitor 30 in the preferred embodiment of the present invention is illustrated. The variable capacitor 30 in the present invention includes a first storage electrode of conductive materials 34 and a second storage electrode of conductive materials 46. Two conductive pad 72 and 74 interconnecting with the first storage electrode 34 and the second storage electrode 46, respectively, provide connections for employing the capacitor element. Referring to FIG. 7b, the two storage electrodes, 34 and 46, are coupled by a variable length supports 49 therebetween, for splitting the first storage electrode 34 and the second storage electrode 46 apart. The variable length supports 49 varies the capacitance through varying a dielectric space 54 between the two electrodes by an electrical input. The variable length support 49 in the preferred embodiment is a pair of resistors 48a and 48b connected in serial, as shown in FIG. 2a and FIG. 2b.

The resistors 48a and 48b are formed within the variable means for splitting the first storage electrode 34 and the second storage electrode 46 apart.

Figure 2B:
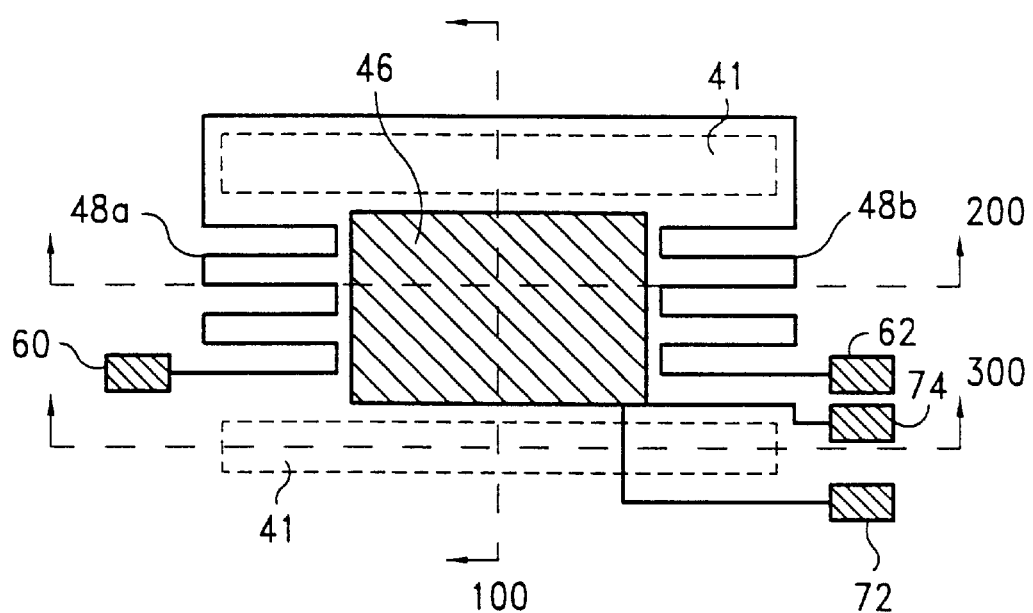
FIG. 2b shows a top view of a variable capacitor in the present invention.
Figure 6A:
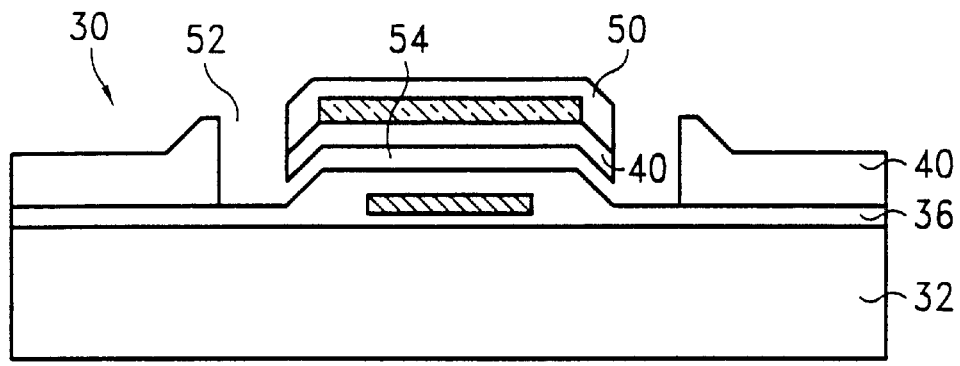
FIG. 6a, in a side cross section view with respect to reference line 100, illustrates the formation of a variable capacitor by etching the third sacrificial layer, the second sacrificial layer, and the first sacrificial layer.
Figure 6B:
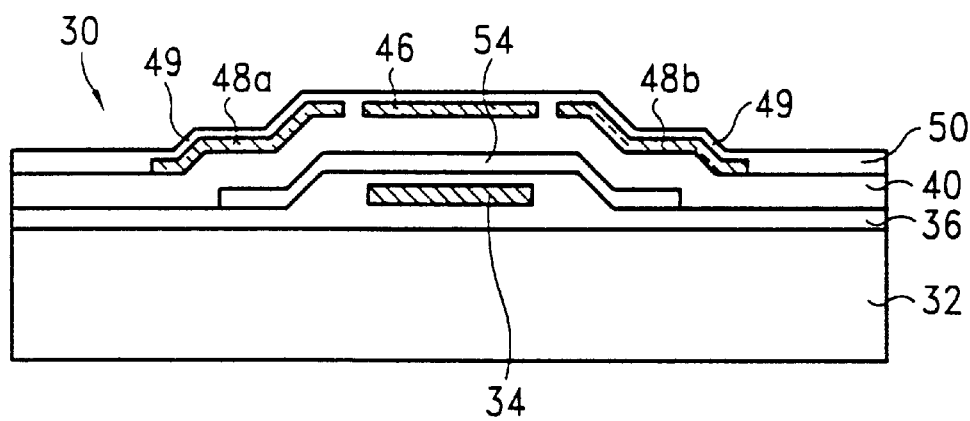
FIG. 6b, in a front cross section view with respect to reference line 200, illustrates the formation of a variable capacitor by etching the third sacrificial layer, the second sacrificial layer, and the first sacrificial layer.

Referring to FIG. 2b, two conductive pads 60 and 62 connect with the two ends of the two resistors 48a and 48b in serial. The two conductive pads 60 and 62 provide connections to an electrical input for changing the dielectric space therebetween, in accordance with heat buckling of the structure as the resistors being heated. In addition, two or more layers of dielectric material can be placed between and adjacent to the first storage electrode 34 and the second storage electrode 46. FIG. 6b shows an example of two dielectric layers 36 and 49 placed adjacent to the first and the second storage electrode, respectively, which will be illustrated in detail with following descriptions. Three reference lines shown in FIG. 2b provide references of cross section view for better understanding of the capacitor structure. The three reference lines include a side sectioning line 100, a first front sectioning line 200, and a second front sectioning line 300.

Figure 3A:
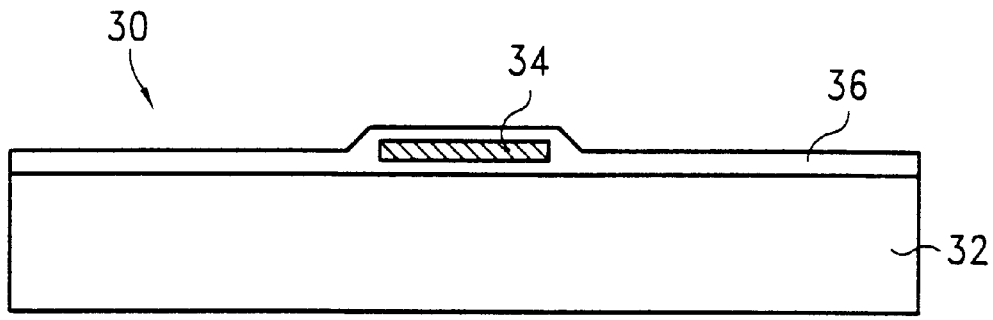
FIG. 3a, in a side cross section view with respect to reference line 100, illustrates the formation of a first storage electrode and a first dielectric layer on a substrate in accordance with the preferred embodiment of the present invention.
Figure 3B:
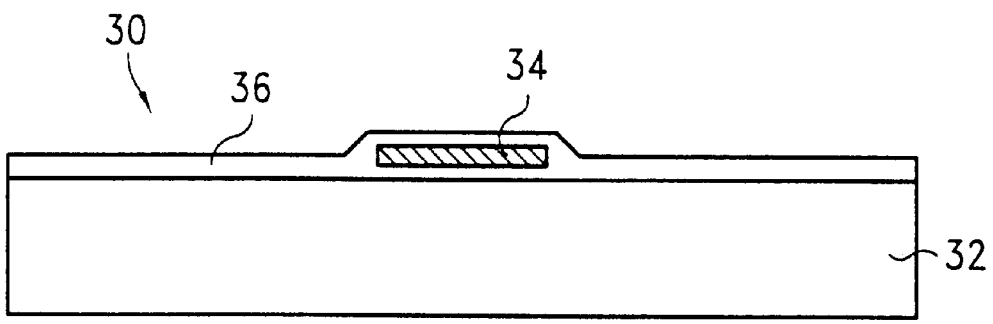
FIG. 3b, in a front cross section view with respect to reference line 200, illustrates the formation of a first storage electrode and a first dielectric layer on a substrate in accordance with the preferred embodiment of the present invention.
Figure 3C:
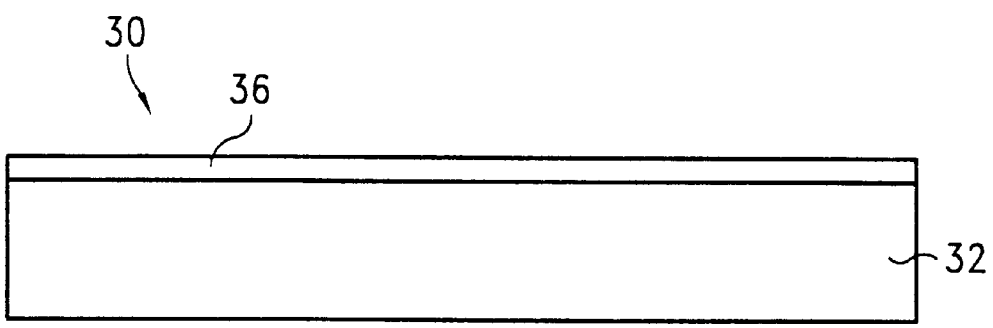
FIG. 3c, in a front cross section view with respect to reference line 300, illustrates the formation of a first dielectric layer on a substrate in accordance with the preferred embodiment of the present invention.

FIG. 3a is a side cross section view with respect to the side sectioning line 100, FIG. 3b is a front cross section view with respect to the side sectioning line 200, and FIG. 3c is a front cross section view with respect to the side sectioning line 300. A formation of a capacitor structure are shown respectively in the three figures with different sectioning lines. The present invention is described with a method of manufacturing the variable capacitor on a semiconductor wafer as a preferred embodiment. A substrate 32 of a semiconductor device shown in FIG. 3a and FIG. 3b is typically a monocrystalline polysilicon, but other semiconductor materials such as crystalline silicon, non-crystalline silicon, aluminum gallium arsenide, silicon-on-sapphire, gallium arsenide, and indium phosphide can be used. The substrate 32 may also be a substrate with semiconductor devices like complementary metal oxide semiconductor (CMOS), bipolar complementary metal oxide semiconductor (BiCMOS), and bipolar junction transistor (BJT) formed within, and with a planar surface for later process of making interconnections and capacitors.

A first conductive layer 34 is deposited on the substrate 32. A photoresist formed on the first conductive layer is patterned with a lithography process with a specified shape. Then an etching process is utilized to form a first storage electrode 34 of the capacitor as shown in FIG. 3a and FIG. 3b. The shape of the first storage electrode 34 is generally rectangular and the size depends on the specified ability in storing electric charge, namely the capacitance needed. In addition, an ion-implanting process for implanting impurities into the a region of semiconductor substrate can be alternatively applied for forming a first storage electrode 34. A first dielectric layer 36 covered the first storage electrode 34 and the substrate 32 is formed as shown in FIG. 3a, FIG. 3b and FIG. 3c. The first dielectric layer 36 is generally formed by a chemical vapor deposition. The dielectric material in the first dielectric layer 36 is chosen mainly for high permittivity like silicon dioxide, silicon nitride, silicon-oxy-nitride (SON), $Ta_2O_5$.

Figure 4A:
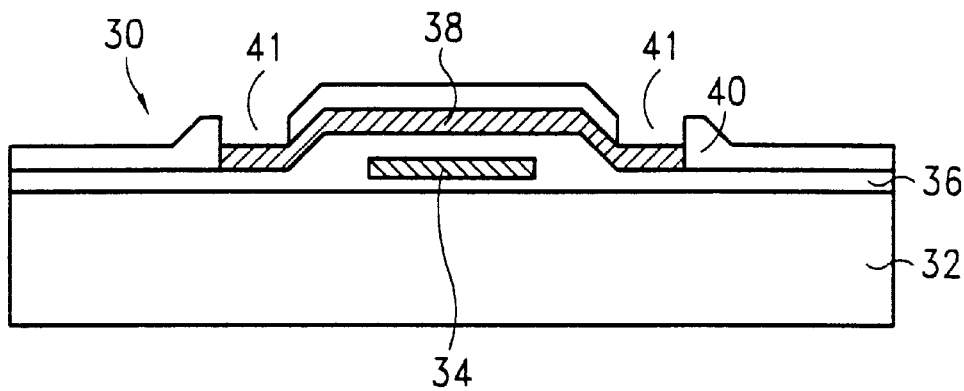
FIG. 4a, in a side cross section view with respect to reference line 100, illustrates the formation of a first sacrificial layer, a second dielectric layer, and a pair of contact channels.
Figure 4B:
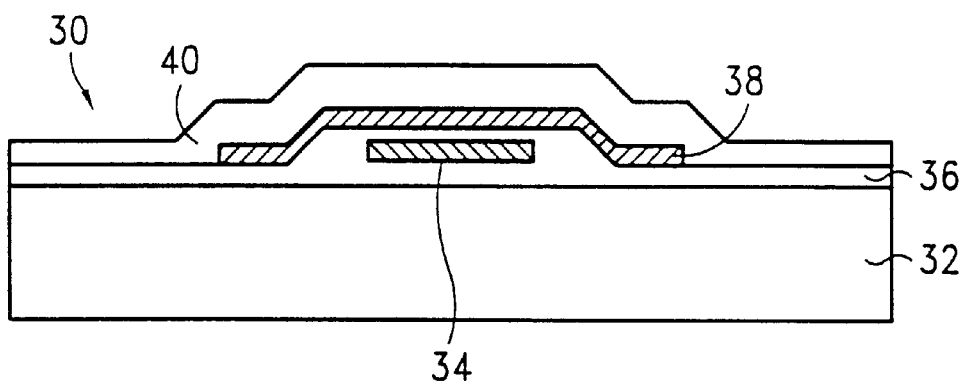
FIG. 4b, in a front cross section view with respect to reference line 200, illustrates the formation of a first sacrificial layer and a second dielectric layer.
Figure 4C:
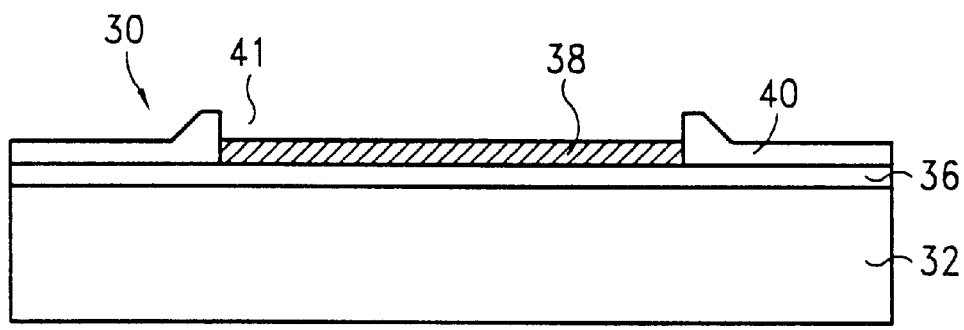
FIG. 4c, in a front cross section view with respect to reference line 300, illustrates the formation of a first sacrificial layer, a second dielectric layer, and a contact channel.

Referring to FIG. 4a, FIG. 4b, and FIG. 4c, a first sacrificial layer 38 is formed by chemical vapor depositing or sputtering, for example, a metal layer. In the embodiment, sputtering aluminum is applied in forming the first sacrificial layer 38. The first sacrificial layer 38 serves mainly as a sacrificial layer for vacuuming a dielectric space. The dielectric space will be vacuumed after the etching of first sacrificial layer in a subsequent step. A photoresist formed above the first sacrificial layer is patterned by a lithography process, with an approximately rectangular shape conformed above the first electrode 34. A portion of the sacrificial layer 38 for vacuuming the dielectric space dielectric region, is then formed as shown in FIG. 4a, FIG. 4b, and FIG. 4c, by removing defined portion of the first sacrificial layer 38 in an etching process.

A second dielectric layer 40 is formed on the first sacrificial layer 38 and the first dielectric layer 36, as shown in FIG. 4b. The second dielectric layer 40 can be formed by chemical vapor depositing a dielectric material chosen mainly for high permittivity like silicon dioxide, silicon nitride, silicon-oxy-nitride (SON), $Ta_2O_5$. Referring to FIG. 4a and FIG. 4c, a pair of contact channels 41 above a pair of edges of the first sacrificial layer, is then defined by etching the second dielectric layer 40 to the depth of the first sacrificial layer. The pair of contact channels 41 provides a space for forming a following layer therewithin. The following layer serves as a continuation in material to be etched for vacuuming the dielectric space. Namely, the continuation in material will be etched for an etchant to reach the first sacrificial layer 38. A second sacrificial layer 42 is formed and patterned employing the same process as those employed for forming the first sacrificial layer 38. The second sacrificial layer 42 serving as a continuation in the material in the pair of etching channels, is generally a metal layer formed by chemical vapor deposition or sputtering.

Figure 4D:
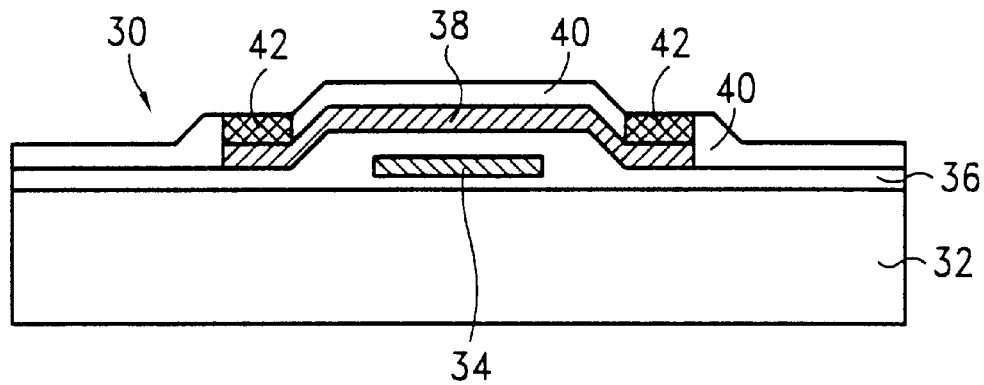
FIG. 4d, in a side cross section view with respect to reference line 100, illustrates the formation of a second sacrificial layer.
Figure 4E:
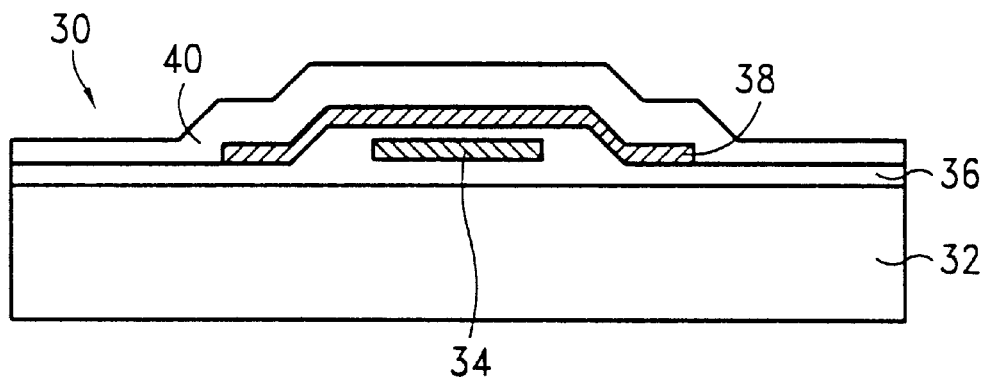
FIG. 4e, in a front cross section view with respect to reference line 200, illustrates the substrate with a first sacrificial layer and a second dielectric layer.
Figure 4F:
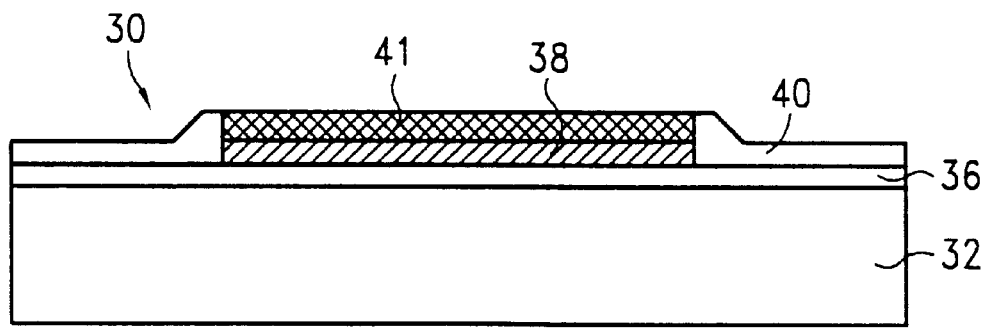
FIG. 4f, in a front cross section view with respect to reference line 300, illustrates the formation a second sacrificial layer.

Referring to FIG. 4d and FIG. 4f, the second sacrificial layer 42 formed within the pair of contact channels is substantially shaped in two columns forming above and around the two edges of the first sacrificial layer 38. The pair of columns is in continuation with the first sacrificial layer 38 for utilized as a pair of etching channel in subsequent step.

Figure 5A:
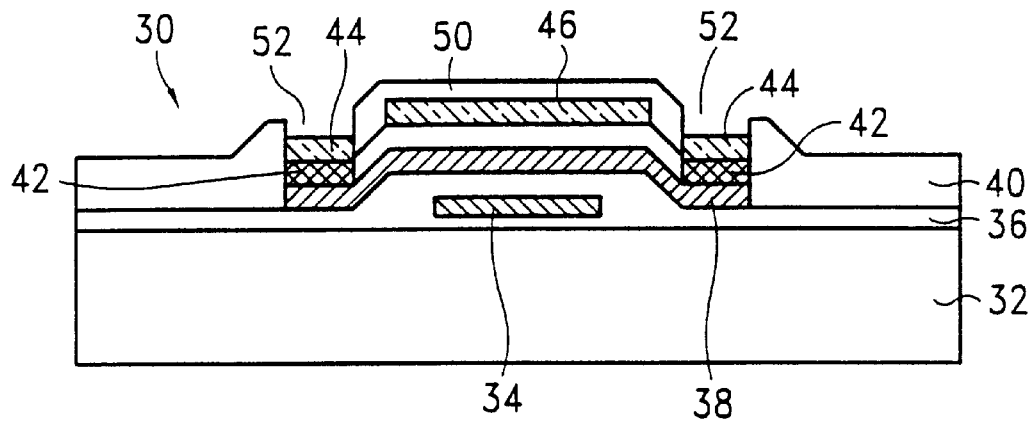
FIG. 5a, in a side cross section view with respect to reference line 100, illustrates the formation of a third sacrificial layer and a second conductive layer.
Figure 5B:
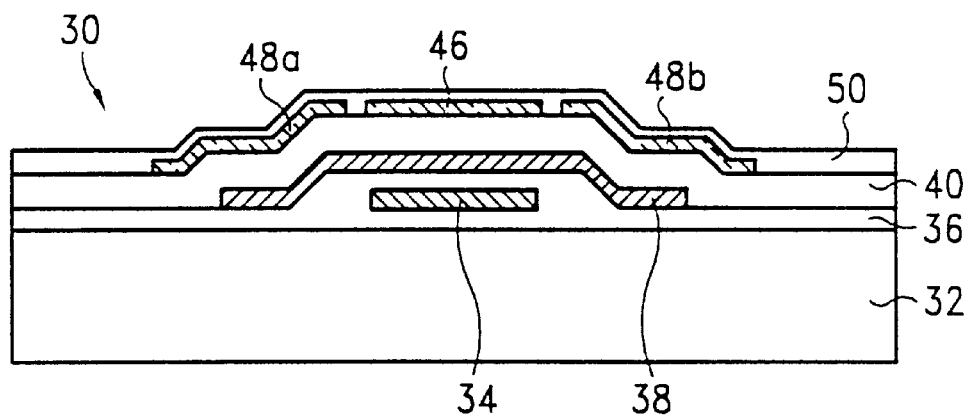
FIG. 5b, in a front cross section view with respect to reference line 200, illustrates the formation of a second conductive layer and a resistor pattern.
Figure 5C:
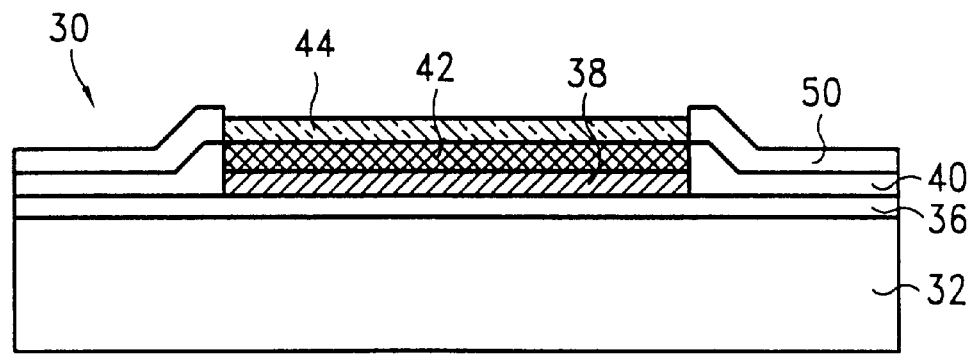
FIG. 5c, in a front cross section view with respect to reference line 300, illustrates the formation of a third sacrificial layer.
Figure 8A:
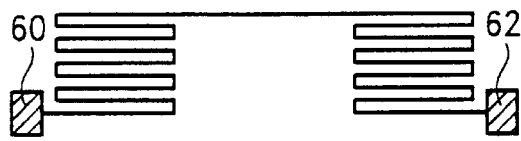
FIG. 8a illustrates an example of a resistor pattern.
Figure 8B:
FIG. 8b illustrates an example of a resistor pattern.

A second conductive layer including 44, 46, and 48 is then formed on the second sacrificial layer 42 and the second dielectric layer 40 by sputtering or chemical vapor depositing a metal layer. Sputtering a metal layer is utilized in the embodiment for forming the second conductive layer. The second conductive layer is then patterned for forming a third sacrificial layer 44, a second storage electrode 46, and a pair of resistors 48a and 48b as shown in FIG. 5a, FIG. 5b, and FIG. 5c. The third sacrificial layer 44, used as a continuation in the material being etched through, has substantially the same pattern as the second sacrificial layer 42 and is in contact with the second sacrificial layer 42. The shape of the second storage electrode 46 is generally rectangular and the size depends on the specified ability in storing electric charges or the capacitance needed. Two resistors 48a and 48b are defined for long circuit path to generate heat power under electricity. One example of pattern for the resistors is illustrated in FIG. 8a with the snake like circuit path. The two resistors are in serial connection and have connecting pads 60 and 62 at the two ends. Another example of pattern is in FIG. 8b with two circling circuit paths. The two resistors 48a and 48b have connecting pads 60 and 62 at one end and two additional pads 64 and 66 for connecting with adjacent layer at another end. Obviously, there are many more patterns can also achieve the same function without further description to a person skilled in the art.

Figure 6C:
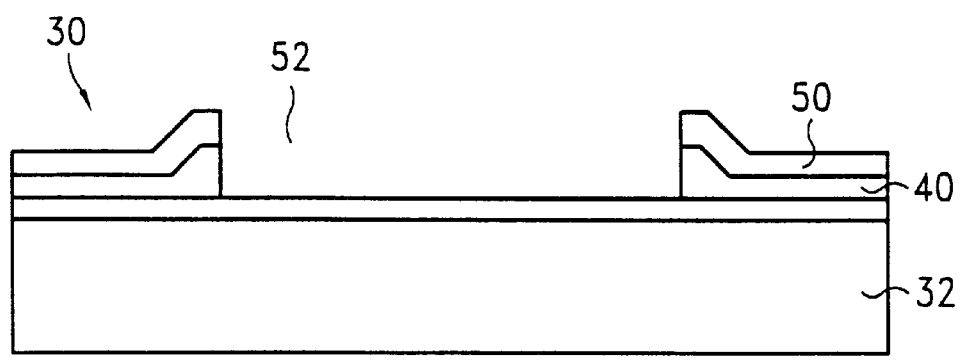
FIG. 6c, in a front cross section view with respect to reference line 300, illustrates the formation of a variable capacitor by etching the third sacrificial layer, the second sacrificial layer, and the first sacrificial layer.

A passivation layer 50 is then formed on the third sacrificial layer 44, the second storage electrode 46, and the resistors 48a and 48b by depositing a typical passivation layer like silicon dioxide, silicon nitride, silicon-oxy-nitride (SON), phosphosilicate glass (PSG), borophosphosilicate glass (BPSG). An etching process is performed following with a lithography process applied with the same mask defining the pattern of the contact channels. The passivation layer 50 is etched to expose the third sacrificial layer 44 as shown in FIG. 5a and 5c. Finally, an etching process is applied for etching through third sacrificial layer 44 and the second sacrificial layer 42 as an etching channel, and then etching out the first sacrificial layer 38 to form a dielectric space 54, as shown in FIG. 6a, FIG. 6b, and FIG. 6c. A wet isotropic etching with etchants like chlorine compounds can be applied.

Therefore, a variable capacitor 30 as shown in FIG. 6a and FIG. 6b is formed. Referring to FIG. 7a and FIG. 7b, as the resistor 48 of the variable capacitor 30 is connected and heated with an electricity input, a thermal buckling of the supporting arms 49 in the direction 56 is generated under heating. The heating pushes the second storage electrode 46 upwards in the direction 58 and varies the capacitance of the variable capacitor 30 under the expansion of the dielectric space 54. The capacitance is adjusted by the variation in the distance between the two storage electrodes, by controlling the expansion of the dielectric space 54 through an electricity input.

Figure 9:
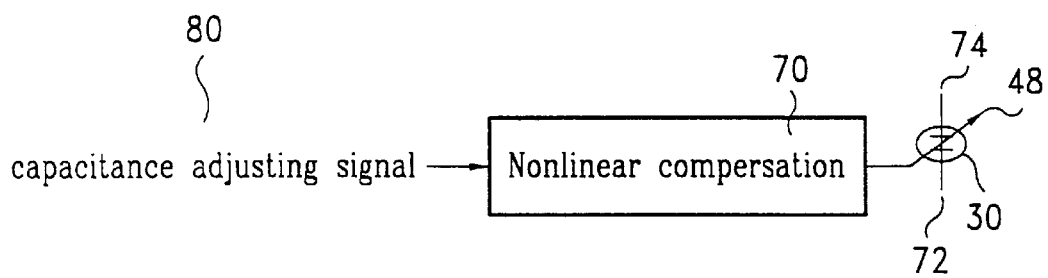
FIG. 9 illustrates a nonlinear compensation circuit for the variable capacitor.
Figure 10:
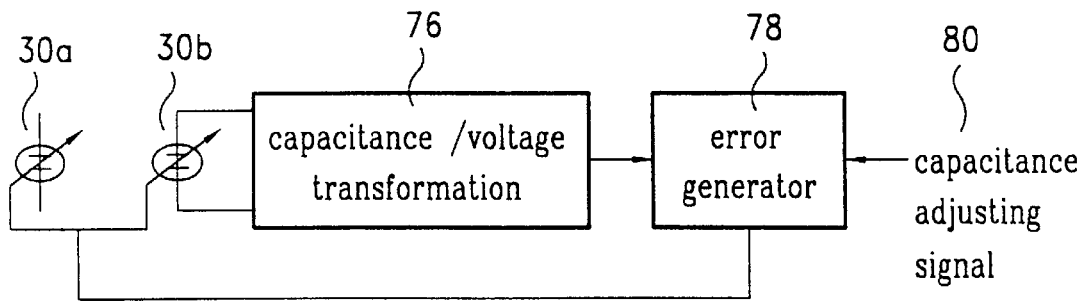
FIG. 10 illustrates a feedback circuit compensation for the variable capacitor.

With FIG. 9, since the thermal buckling under electricity is nonlinear, the capacitor 30 is connected with a nonlinear compensation circuit 70 to adjust the input The input to the resistor 48 is varied for controlling the capacitance at a specified value determined by an input capacitance adjusting signal 80. For a more precise control of the capacitance, a feedback circuit shown in FIG. 10 can be utilized. A reference capacitor 30b is applied in accompanying with a capacitor 30a Both the capacitors 30a and 30b are controlled with the same input. The capacitance of the capacitor 30b is measured and transformed to a voltage signal by a capacitance/voltage transformation circuit 76. The signal is compared with a capacitance adjusting signal 80 in a error generator 78 for determining the deviation. The differential generator transforms the deviation for control the input to the capacitors 30a and 30b for a specified capacitance.

A capacitor with variable capacitance which can be modified and tuned through an electric input for providing an accurate capacitance to a specified value is provided in the present invention. The method can greatly reduce the size of the filtering circuits and power supplying devices by integrating a variable capacitor within the integrated circuits. The problem of a electromagnetic noise influence to the outwardly connected variable capacitor devices is no longer existed. A complicate way of obtaining specified capacitance through combining a number of capacitors connecting in parallel is no longer needed. The embodiment mentioned above can be combined into a semiconductor manufacturing process having three or more layer of interconnections with modification in masks only. The compatibility of the method of the present invention with the conventional semiconductor process manufacturing CMOS, BiCMOS, and BJT, greatly eliminates the efforts for accomplishing an accurate capacitor in the typical method and thus reduces the manufacturing cost As is understood by a person skilled in the art, the foregoing description of the preferred embodiment of the present invention is illustrative of the present invention rather than a limitation thereon. It is intended to cover various modifications and similar arrangements included within the spirit and scope of the appended claims, the scope of which should be accorded with the broadest interpretation so as to encompass all such modifications and similar structure.

What is claimed is:

1. A method for manufacturing a variable capacitor, said method comprising the steps of:
    forming a first storage electrode on a substrate;
    forming a first dielectric layer on said first storage electrode and said substrate;
    forming a first sacrificial layer on said first dielectric layer;
    removing a portion of said first sacrificial layer to form a dielectric region over said first storage electrode;
    forming a second dielectric layer on said first sacrificial layer and said first dielectric layer;
    removing a portion of said second dielectric layer to form a pair of contact channels to said first sacrificial layer;
    forming a second sacrificial layer over said first sacrificial layer within said pair of contact channels and on said second dielectric layer;
    removing a portion of said second sacrificial layer for leaving a portion of said second sacrificial layer within said pair of contact channels of said second sacrificial layer;
    forming a second conductive layer on said second sacrificial layer and said second dielectric layer;
    removing a portion of said second conductive layer for forming a third sacrificial layer, a second storage electrode, and a resistor pattern;
    forming a passivation layer on said third sacrificial layer, said second storage electrode, said resistor pattern, and said second dielectric layer;
    removing a portion of said passivation layer to expose said third sacrificial layer; and
    removing said third sacrificial layer, said second sacrificial layer, and said first sacrificial layer for having a dielectric space between said first dielectric layer and said second dielectric layer.

2. The method of claim 1, wherein said first storage electrode is formed by the steps of:
    forming a first conductive layer over said substrate; and
    removing selective portions of said first conductive layer for forming said first storage electrode.

3. The method of claim 2, wherein said first conductive layer is a metal layer formed by sputtering.

4. The method of claim 2, wherein said first conductive layer is a polysilicon layer formed by chemical vapor deposition.

5. The method of claim 1, wherein said first storage electrode is formed by an ion implantation process implanting impurities to a region of said substrate for forming said first storage electrode.

6. The method of claim 1, wherein said first dielectric layer is a silicon dioxide layer formed by chemical vapor deposition.

7. The method of claim 1, wherein said first sacrificial layer is a metal layer formed by sputtering.

8. The method of claim 7, wherein said metal layer is an aluminum layer.

9. The method of claim 1, wherein said second dielectric layer is a silicon dioxide layer formed by chemical vapor deposition.

10. The method of claim 1, wherein said second sacrificial layer is a metal layer formed by sputtering.

11. The method of claim 1, wherein said second conductive layer is a metal layer formed by sputtering process.

12. The method of claim 1, wherein said step of removing said third sacrificial layer, said second sacrificial layer, and said first sacrificial layer for having a dielectric space is performed by an isotropic wet etching.

13. A method for manufacturing a variable capacitor, said method comprising the steps of:

forming a first storage electrode on a substrate;

forming a first silicon dioxide layer by chemical vapor deposition on said first storage electrode and said substrate;

forming a first metal sacrificial layer by sputtering over said first silicon dioxide layer;

removing a portion of said first metal sacrificial layer to form a dielectric region substantially over said first storage electrode;

forming a second silicon dioxide layer by chemical vapor deposition on said first metal sacrificial layer and said first silicon dioxide layer;

removing a portion of said second silicon dioxide layer to form a pair of contact channels to said first metal sacrificial layer;

forming a second metal sacrificial layer by sputtering over said pair of contact channels and second silicon dioxide layer;

removing a portion of said second metal sacrificial layer for leaving a portion of said second metal sacrificial layer within said pair of contact channels;

forming a second conductive layer by sputtering a metal layer on said second metal sacrificial layer and said second silicon dioxide layer;

removing a portion of said second conductive layer for forming a third sacrificial layer, a second storage electrode, and a resistor pattern;

forming a passivation layer on said third sacrificial layer, said second storage electrode, said resistor pattern, and said second dielectric layer;

removing selective portions of said passivation layer to expose said third sacrificial layer; and removing said third sacrificial layer, said second sacrificial layer, and said first sacrificial layer by an isotropic wet etching for having a dielectric space between said first dielectric layer and said second dielectric layer.

14. The method of claim 13, wherein said first storage electrode is formed by the method comprising the steps of:

forming a first conductive layer over said substrate; and removing selective portions of said first conductive layer for forming said first storage electrode.

15. The method of claim 14, wherein said first conductive layer is a metal layer formed by sputtering.

16. The method of claim 15, wherein said first conductive layer is a polysilicon layer formed by chemical vapor deposition.

17. The method of claim 13, wherein said first storage electrode is formed by an ion implantation process implanting impurities to a region of said substrate for forming said first storage electrode.

18. The method of claim 13, wherein said first metal sacrificial layer is an aluminum layer.

* * * * *